United States Patent
Lee

(10) Patent No.: US 6,558,987 B2
(45) Date of Patent: May 6, 2003

(54) THIN FILM TRANSISTOR AND METHOD OF FABRICATING THE SAME

(75) Inventor: Seong-Su Lee, Kumi (KR)

(73) Assignee: LG.Philips LCD Co., Ltd., Seoul (KR)

(*) Notice: Subject to any disclaimer, the term of this patent is extended or adjusted under 35 U.S.C. 154(b) by 0 days.

(21) Appl. No.: 09/736,333

(22) Filed: Dec. 15, 2000

(65) Prior Publication Data

US 2001/0012648 A1 Aug. 9, 2001

(30) Foreign Application Priority Data

Dec. 20, 1999 (KR) .......................................... 99-59464

(51) Int. Cl.⁷ .......................... H01L 21/00; H01L 21/84
(52) U.S. Cl. ...................................... 438/149; 438/906
(58) Field of Search ................................. 438/149, 159, 438/216, 906

(56) References Cited

U.S. PATENT DOCUMENTS

| 5,539,551 A | * | 7/1996 | Nomoto et al. ............... 257/59 |
| 5,831,283 A | * | 11/1998 | Batey et al. ................. 257/380 |
| 5,915,172 A | * | 6/1999 | Noumi et al. ................ 438/151 |
| 6,114,184 A | * | 9/2000 | Matsumoto et al. .......... 257/59 |
| 6,124,154 A | * | 9/2000 | Miyasaka .................... 438/151 |
| 6,210,748 B1 | * | 4/2001 | Nagahara et al. ............ 134/1.3 |

* cited by examiner

Primary Examiner—William David Coleman
(74) Attorney, Agent, or Firm—McKenna Long & Aldridge LLP

(57) ABSTRACT

A method of manufacturing a thin film transistor. A gate electrode is formed on a substrate. Then a first gate insulation layer is formed on the gate electrode and on the substrate. The first gate insulation layer is then cleaned to remove contaminates. After cleaning, a second gate insulation layer is then formed on the first gate insulation layer. Beneficially, the first and second gate insulation layers are of the same material. An active layer having an ohmic contact layer is then formed on the second insulation layer. Spaced apart source and drain electrodes are then formed on the ohmic contact.

24 Claims, 3 Drawing Sheets

THIN FILM TRANSISTOR AND METHOD OF FABRICATING THE SAME

This application claims the benefit of Korean Patent Application No. 1999-59464, filed on Dec. 20, 1999, which is hereby incorporated by reference for all purposes as if fully set forth herein.

BACKGROUND OF THE INVENTION

1. Field of the Invention

The present invention relates to thin film transistors (TFT) of the type used in liquid crystal display (LCD) devices. More particularly, it relates to the insulation layers of such TFTs.

2. Discussion of the Related Art

A liquid crystal display (LCD) device uses the optical anisotropy and polarization properties of liquid crystal molecules to produce a predetermined image. Liquid crystal molecules have a definite orientation that results from their peculiar characteristics. The specific orientation can be modified by an electric field that is applied across the liquid crystal molecules. In other words, electric fields applied across the liquid crystal molecules can change the orientation of the liquid crystal molecules. Due to optical anisotropy, incident light is refracted according to the orientation of the liquid crystal molecules.

In general, liquid crystal display (LCD) devices use thin film transistors (TFTs) as switching elements that control the electric fields applied across the liquid crystal molecules.

An active matrix LCD (AM-LCD) incorporates a matrix of thin film transistors (TFTs) and pixel electrodes. Active matrix LCD (AM-LCD) are beneficial in that they can have high resolution and can be superior to alternative types when displaying moving images.

FIG. 1 is a cross-sectional view illustrating a conventional active matrix liquid crystal display (LCD) panel. As shown in FIG. 1, the LCD panel 20 has a lower substrate 2, an upper substrate 4, and an interposed liquid crystal layer 10. The lower substrate 2, which is referred to as an array substrate, has a TFT "S" that acts as a switching element to change the orientation of the liquid crystal molecules in the liquid crystal layer 10. As shown, the TFT "S" contacts a pixel electrode 14. The upper substrate 4 includes a color filter 8 that produces a color pixel image, and a common electrode 12 on the color filter 8. The common electrode 12 serves as a corresponding electrode for the pixel electrode 14. Together, voltages applied to those electrodes produce an electric field across the liquid crystal layer 10. The pixel electrode 14 is arranged over a pixel region, i.e., a display area. Furthermore, to prevent leakage of the liquid crystal layer, interposed between the substrates 2 and 4 is a sealant 6.

The principle of operating the AM-LCD device will now be explained. When a gate electrode 30 receives a gate signal that causes the TFT to turn ON, the data signals on a data line are applied to the pixel electrode 14. This induces an electric field across the liquid crystal molecules and causes those molecules to attain an orientation that depends on the data signals. On the other hand, when the gate electrode 30 receives a gate signal that causes the TFT to turn OFF, data signals are not applied to the pixel electrode 14. This removes the electric field and causes the liquid crystal molecules to attain a "relaxed" orientation.

In general, the manufacturing process for an active matrix liquid crystal display (LCD) panel depends on the materials used and on the design goal. For example, the resistivity of the materials used for the gate and data lines are important factors in the picture quality of large (say over 18 inch) LCD panels and of high resolution (for example SXGA or UXGA) LCD panels. With such LCD panels it is beneficial to use Aluminum (Al) or an Al-alloy for the gate lines and data lines.

LCD devices usually use inverted staggered type TFTs because such TFTs have a relatively simple structure and a superior efficiency. Inverted staggered type TFTs can be classified as either back channel etched (EB) or etch stopped (ES), depending on the fabrication method used. The manufacturing method of a back channel etched type TFT will now be explained.

FIG. 2 is a cross-sectional view of a back channel etched type TFT "S" as used in a conventional LCD device. As shown in FIG. 2, the TFT "S" includes: a substrate 1; a gate electrode 30 on the substrate 1; a gate insulation layer 32 over the substrate and over the gate electrode 30; an active layer 34 on the gate insulation layer 32; a source electrode 38 and a drain electrode 40 that are spaced apart from each other and that overlap sides of the active layer 34; and an ohmic contact layer 36 that is disposed between the active layer 34 and the source and drain electrodes 38 and 40.

The gate insulation layer 32 can be formed at relatively low temperature (below 350°). A material having superior insulation properties, such as Silicon Nitride ($SiN_x$) or Silicon Oxide ($SiO_2$), is beneficially used for the gate insulation layer 32. Moreover, pure amorphous silicon (a-Si:H) is beneficially used to form the active layer 34. Such silicon can also be formed at the relatively low temperatures used to form the gate insulation layer 32. After forming the active layer, the ohmic contact layer 36 is formed using a doped amorphous silicon (such as $n^+$ a-Si:H). To dope the amorphous silicon, a doping gas having Boron or Phosphorous can be used. In a conventional LCD device, Phosphine ($PH_3$), which includes Phosphorous, is generally used. The source and drain electrodes 38 and 40 are beneficially comprised of Chrome or Molybdenum.

FIG. 3 is a flow-chart illustrating the manufacturing process steps of the conventional TFT illustrated in FIG. 2.

In the first step, ST200, a glass substrate is provided and cleaned. That cleaning removes debris particles, organic materials, and other alien substances from the substrate. This reduces defects and enhances the overall properties of the resulting TFT. Furthermore, it improves adhesion between the substrate and subsequent layers, include a subsequent metal layer.

In the second step, ST210, a metal such as Aluminum or Molybdenum is deposited. Then, using a lithography process the gate electrode and a first capacitor electrode, which are portions of a gate line, are formed.

In the third step, ST220, the gate insulation layer and the semiconductor layers (the active layer and the ohmic contact layer) are sequentially formed. The gate insulation layer is beneficially comprised of Silicon Oxide or Silicon Nitride, and has a thickness of about 3000 Å.

In the fourth step, ST230, the source and drain electrodes are formed by depositing and patterning a metallic material such as Chrome (Cr) or Cr-alloy.

In the fifth step, ST240, a channel region is formed by removing the portion of the doped amorphous silicon (ohmic contact layer) between the source and drain electrodes. In this step, the source and drain electrodes are used as masks. If the portion of the ohmic contact layer between the source and drain electrodes is not removed, serious problems of deteriorated electrical characteristics and lower efficiencies can result in the final TFT.

Generally, the process steps of fabricating the TFT include a step of forming the gate insulation layer, a step of forming the semiconductor layers, and a step of forming the electrodes. The forming of the gate insulation layer and the forming of the semiconductor layers are beneficially performed in the same apparatus.

A CVD (chemical vapor deposition) apparatus is generally used to form the gate insulation layer. A mixture of various gases is injected into the CVD apparatus, which is kept in a vacuum. The gate insulation layer is then formed by chemical reactions of the injected gases. For example, an inert gas (Helium: He), a silicon compound gas (Silane: $SiH_4$), and a nitrogen compound gas (Ammonia: $NH_3$) can be reacted together in the CVD apparatus to form a Silicon Nitride ($SiN_x$) gate insulation layer. However, polymer materials are inevitably created in the CVD apparatus. When forming the insulation layer, those polymer materials can act as particles and alien substances that can induce defects in the TFT. For this reason, the CVD apparatus should always be cleaned. However, there is no perfect way to solve the polymer material problem.

FIG. 4 is an enlarged view of the portion "A" of FIG. 2. As shown in FIG. 4, if a particle or alien substance "P" is formed on the gate electrode 30 when forming the gate insulting layer 32, the later deposited layers, such as the gate insulation layer 32, the active layer 34 and the ohmic contact layer 36, grow abnormally. Thus, the drain electrode 40 can contact the gate electrode 30 through the abnormal growth portion, i.e., they are short-circuited. This means that the TFT will not function properly.

As shown in FIG. 5, a particle or alien substance "P" (a contaminate) can be also form on the gate insulation layer 32 itself. In this case, the active layer 34 can be damaged, causing a deterioration of the TFT.

Moreover, when forming the gate insulation layer, a pinhole (see FIG. 7A) can occur in the gate insulation layer and can grow vertically. This can also cause deterioration of the TFT.

SUMMARY OF THE INVENTION

Accordingly, the present invention is directed to a method of manufacturing a thin film transistor (TFT) (as well as the TFT itself) that substantially obviates one or more of the problems due to limitations and disadvantages of the related art.

To overcome the problems described above, the principles of the present invention provide a method of manufacturing a thin film transistor (TFT) that includes an effective method of preventing the occurrence of the polymer and the pinhole.

Additional features and advantages of the invention will be set forth in the description that follows, and in part will be apparent from that description, or may be learned by practice of the invention. The objectives and other advantages of the invention will be realized and attained by the structure particularly pointed out in the written description and claims hereof as well as the appended drawings.

To achieve the above objects, the principles of the present invention provide a method of manufacturing a TFT. That method includes providing a substrate, forming a gate electrode on the substrate, forming a first gate insulation layer on the gate electrode and on the gate electrode, and cleaning the first gate insulation layer. After cleaning, the method continues by forming a second gate insulation layer on the first gate insulation layer, sequentially forming a pure semiconductor layer and a doped semiconductor layer on the second gate insulating layer, forming spaced apart source and drain electrodes, and forming a channel region using the source and drain electrodes as a mask.

To clean the first gate insulation layer, the cleaning process is beneficially performed using a brush. The second gate insulation layer is beneficially comprised of the same material as the first gate insulation layer, which is preferably an inorganic material such as $SiN_x$ and $SiO_2$. The pure semiconductor layer and the doped semiconductor layer are etched to form an active layer and an ohmic contact layer by using source and drain electrodes as a mask.

To achieve the above objects, the principles of the present invention further provide for a TFT that includes a substrate, a gate electrode on the substrate, a first gate insulation layer on the gate electrode, and a second gate insulation layer on the first gate insulation layer. The second gate insulation layer is beneficially comprised of the same material as the first gate insulation layer and has the thickness that is 50 to 200% that of the first insulation layer. The TFT further includes an active layer on the second insulation layer, an ohmic contact layer on the active layer, and spaced apart source and drain electrodes on the ohmic contact layer.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF AN ILLUSTRATED EMBODIMENT

Reference will now be made in detail to an illustrated embodiment of the present invention, the example of which is shown in the accompanying drawings.

Figure 1:
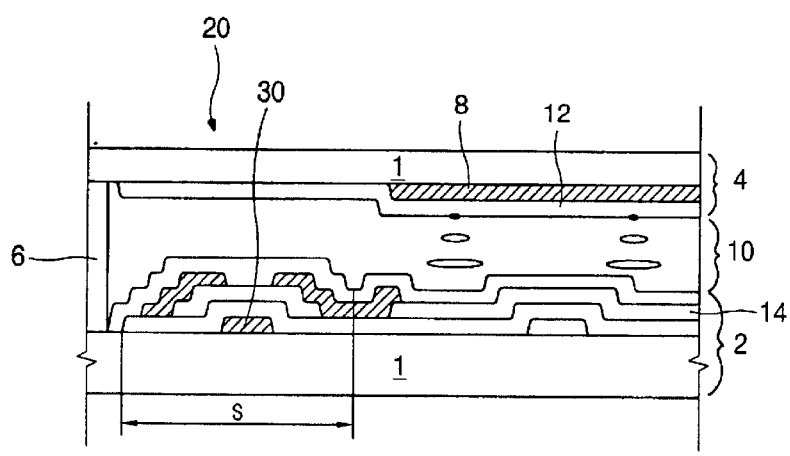
FIG. 1 is a cross-sectional view illustrating a conventional liquid crystal display (LCD) panel.
Figure 2:
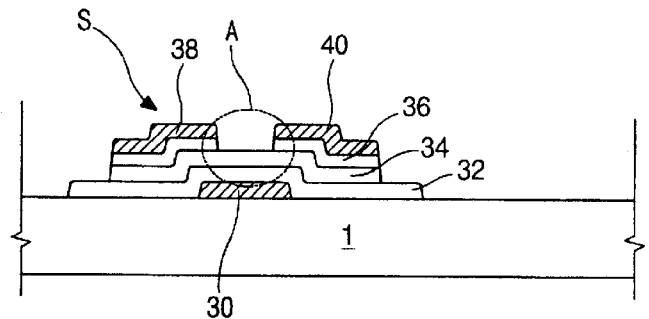
FIG. 2 is a cross-sectional view of a back channel etched type TFT as used in a conventional LCD device.
Figure 3:
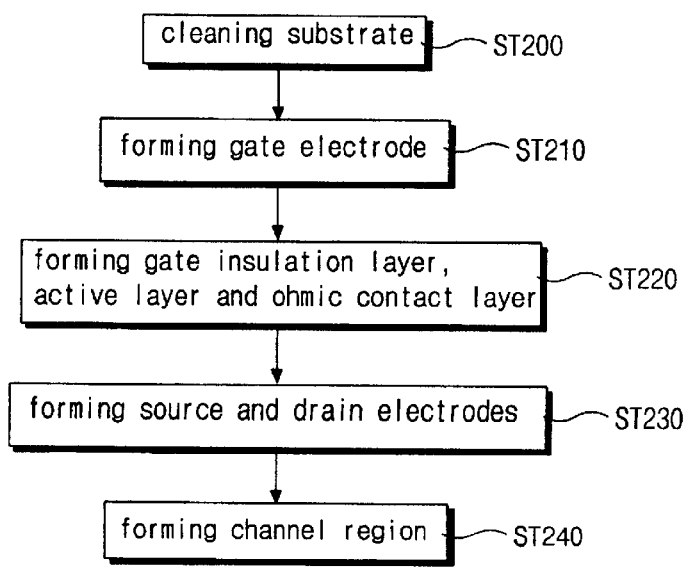
FIG. 3 is a flow-chart of illustrating the manufacturing process steps of the conventional TFT illustrated in FIG. 2.
Figure 4:
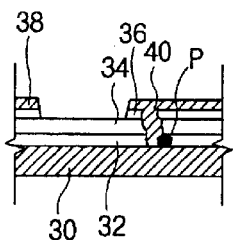
FIG. 4 is an enlarged view illustrating the portion "A" of FIG. 2 when that portion includes a first type of defect-inducing particle.
Figure 5:
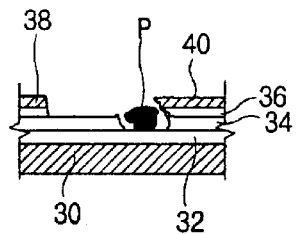
FIG. 5 is an enlarged view illustrating the portion "A" of FIG. 2 when that portion includes another type of defect-inducing particle.
Figure 6:
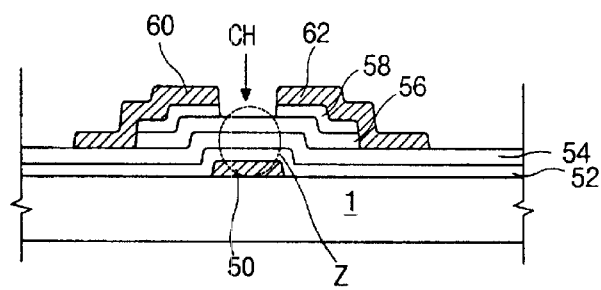
FIG. 6 is a cross-sectional view illustrating a TFT according to the principles of the present invention.

FIG. 6 is a cross-sectional view illustrating a TFT according to the principles of the present invention. A gate electrode 50 is formed on a substrate 1. The gate electrode is beneficially comprised of a material such as Chrome (Cr), Aluminum (Al), or Molybdenum (Mo). A first gate insulation layer 52 is formed over the substrate and over the gate electrode 50. The thickness of the first gate insulation layer 52 is approximately 30 to 70% of that of a conventional gate insulation layer (about 3000 Å). The surface of the first gate insulation layer is then cleaned by a cleaning process. A second gate insulation layer 54 is then formed on the cleaned first gate insulation layer 53. The thickness of the second gate insulation layer is 70% to 30% that of a conventional gate insulation layer. The first and second gate insulation layers are beneficially comprised of the same material, preferably a material such as Silicon Nitride ($SiN_x$) or Silicon Oxide ($SiO_2$).

With the second gate insulation layer in place, a pure amorphous silicon layer and a doped amorphous silicon layer are sequentially deposited on the second insulation layer 54. Those silicon layers are then patterned to form an active layer 56 and an ohmic contact layer 58 (which is comprised of the doped amorphous silicon layer). Spaced apart source and drain electrodes 60 and 62 are then formed on the ohmic contact layer 58 using a patterning process. The doped amorphous silicon between the source electrode and the drain electrode is then removed to form a channel region "CH". That removal is beneficially performed using a patterning process in which the source and drain electrodes act as masks.

As the illustrated TFT includes two gate insulation layers, defects caused by polymer contaminates created during the forming of the composite gate insulation layer can be decreased. Furthermore, even if a polymer contaminate occurs when forming the first gate insulation layer, the second gate insulation layer can sufficiently compensate for that polymer contaminate due to the cleaning before the forming of the second insulation layer.

Figure 7A:
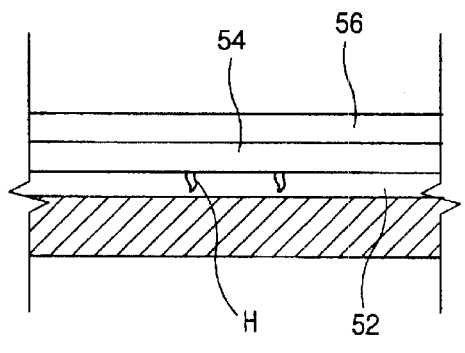
FIGS. 7A and 7B are enlarged views illustrating possible conditions in the portion "Z" of FIG. 6.
Figure 7B:
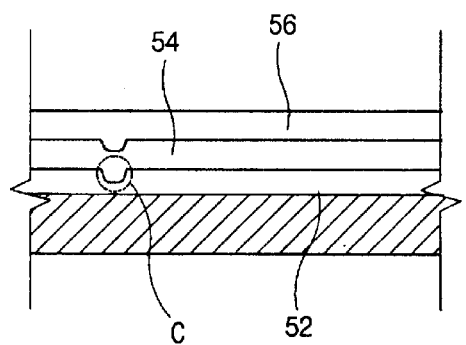

FIGS. 7A and 7B are enlarged views illustrating possible conditions within the portion "Z" of FIG. 6.

As shown in FIG. 7A, although pinholes "H" may be formed in the first gate insulation layer 52, the growth of the pinholes "H" are stopped by the second gate insulation layer 54. This is because pin holes "H" in the first gate insulation layer 52 only grow to the interface of the first and second gate insulation layers.

Referring to FIG. 7B, although polymer contaminates can form on the first gate insulation layer 52, the cleaning step tends to remove such contaminates. The subsequently formed second gate insulation layer 54 can compensate for the cave-in portion "C" that remains when a contaminate is removed.

Figure 8:
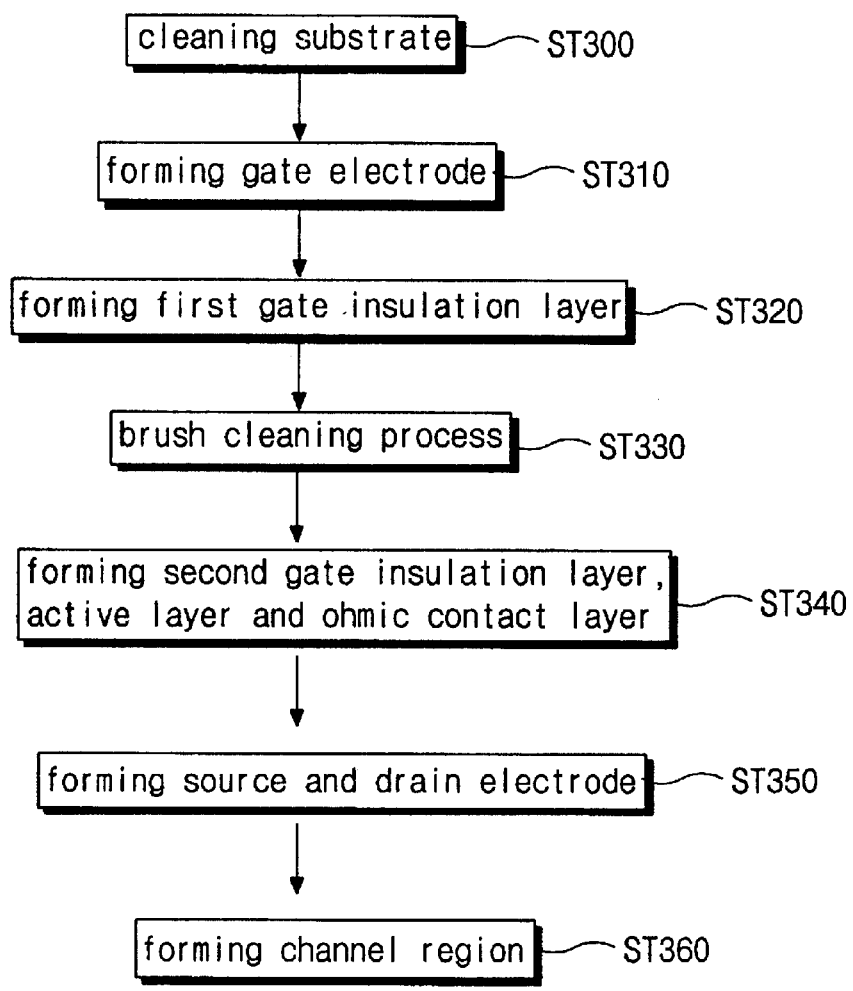
FIG. 8 is a flow chart illustrating manufacturing process steps according to principles of the present invention.

FIG. 8 is a flow chart illustrating the manufacturing process steps according to the illustrated embodiment of the present invention.

In the first step, ST300, a glass substrate is cleaned using a conventional cleaning process. That cleaning process removes particles, organic materials, and alien substances from the substrate. This reduces defects, enhances the properties of the TFT, and improves the adhesion between the substrate and the subsequently deposited metal layer.

In the second step, ST310, a metal comprised of Chrome (Cr), Aluminum (Al), Molybdenum (Mo) or the like is deposited and patterned to form the gate electrode.

In the third step, ST320, the first gate insulation layer is formed over the substrate and over the gate electrode. The thickness of the first gate insulation layer is approximately 30 to 70% that of a conventional gate insulation layer.

In the fourth step, ST330, the surface of the first gate insulation layer is cleaned, beneficially by a cleaning process that uses a brush. This removes polymer contaminates formed on the first gate insulation layer during the forming of the gate insulation layer.

In the fourth step, ST340, the second gate insulation layer, the silicon active layer, and the silicon ohmic contact layer are sequentially formed. More polymer contaminates are created during the forming of the second gate insulation layer than during the forming of the silicon layers. The thickness of the second gate insulation layer is beneficially approximately 70 to 30% that of a conventional gate insulation layer. The active layer and the ohmic contact layer are, respectively, comprised of a pure amorphous silicon material and of a doped amorphous silicon material that are deposited and then patterned. To dope the amorphous silicon, a doping gases which includes Boron (element of group III) or Phosphorous (element of group IV) is used. For example, Phosphine ($PH_3$) can be employed to form an n-type semiconductor layer.

In the fifth step, ST350, the spaced apart source and drain electrodes are formed on the ohmic contact layer by a lithography process.

In the sixth step, ST360, the portion of the doped amorphous silicon (the ohmic contact layer) between the source electrode and the drain electrode is removed to form a channel region. This is performed by a patterning process that uses the source and drain electrodes as masks.

As described above, a method of manufacturing a TFT according to the principles of the present invention forms a first gate insulation layer on a gate electrode on a substrate. Then, the first gate insulation layer is cleaned by a brush cleaning process to remove contaminates. Then, a second gate insulation layer is formed on the cleaned first gate insulation layer. This process reduces problems caused by contaminates. Moreover, pin hole growth in the first gate insulation layer is limited to the interface between the first and second gate insulation layers. This reduces the occurrence of defects caused by pinholes.

It will be apparent to those skilled in the art that various modifications and variation can be made in the present invention without departing from the spirit or scope of the invention. Thus, it is intended that the present invention covers the modifications and variations of this invention provided they come within the scope of the appended claims and their equivalents.

What is claimed is:

1. A method of manufacturing a TFT, comprising:
   forming a gate electrode on a substrate;
   forming a first gate insulation layer over the gate electrode and over the substrate;
   brushing the first gate insulation layer to remove contaminates;
   forming a second gate insulation layer over the brushed first gate insulation layer;
   sequentially forming an active layer and an ohmic contact layer;
   forming spaced apart source and drain electrodes on the ohmic contact layer; and
   forming a channel region by etching the ohmic contact layer.

2. A method of manufacturing a TFT according to claim 1, wherein the first gate insulation layer and the second gate insulation layer are formed from the same material.

3. A method of manufacturing a TFT according to claim 1, wherein the first gate insulation layer is formed from an inorganic material.

4. A method of manufacturing a TFT according to claim 1, forming an active layer includes forming an amorphous silicon layer.

5. A method of manufacturing a TFT according to claim 1, wherein forming a first gate insulation layer over the gate electrode includes depositing an insulation material using chemical vapor deposition.

6. A method of manufacturing a TFT according to claim 1, wherein forming a second gate insulation layer over the brushed first gate insulation layer includes forming a second gate insulation layer over a pinhole in the brushed first gate insulation layer.

7. A method of manufacturing a TFT according to claim 1, wherein forming a second gate insulation layer forms a second gate insulation layer that is between 50% and 200% as thick as the brushed first gate insulation layer.

8. A method of manufacturing a TFT according to claim 1, wherein forming a second gate insulation layer forms a second gate insulation layer that is between 900Å and 2100Å thick.

9. A method of manufacturing a TFT according to claim 3, wherein the first gate insulation layer is formed from silicon nitride ($SiN_x$).

10. A method of manufacturing a TFT according to claim 3, wherein the first gate insulation layer is formed from silicon oxide ($SiO_x$).

11. A method of manufacturing a TFT according to claim 6, wherein forming an ohmic contact layer includes forming a doped amorphous silicon layer.

12. A method of manufacturing a TFT according to claim 8, wherein brushing the first gate insulation layer removes polymer contaminates.

13. A method of manufacturing a TFT, comprising:
   forming a gate electrode on a substrate;
   forming a first gate insulation layer over the gate electrode and over the substrate;
   cleaning the first gate insulation layer by brushing;
   forming a second gate insulation layer over the brushed first gate insulation layer, wherein the second gate insulation layer is made of the same material as the first gate insulation layer;
   sequentially forming an active layer and an ohmic contact layer;
   forming spaced apart source and drain electrodes on the ohmic contact layer; and forming a channel region by etching the ohmic contact layer.

14. A method of manufacturing a TFT according to claim 13, wherein the first gate insulation layer is formed of an inorganic material.

15. A method of manufacturing a TFT according to claim 13, wherein forming an active layer includes forming an amorphous silicon layer.

16. A method of manufacturing a TFT according to claim 13, wherein forming an ohmic contact layer includes forming a doped amorphous silicon layer.

17. A method of manufacturing a TFT according to claim 13, wherein forming the first and second gate insulation layers includes depositing an insulation material using chemical vapor deposition.

18. A method of manufacturing a TFT according to claim 13, wherein cleaning the first gate insulation layer includes brushing the first gate insulation layer.

19. A method of manufacturing a TFT according to claim 13, wherein forming a second gate insulation layer over the first gate insulation layer includes forming a second gate insulation layer over a pinhole in the first gate insulation layer.

20. A method of manufacturing a TFT according to claim 13, wherein forming a second gate insulation layer forms a second gate insulation layer that is between 50% and 200% as thick as the brushed first gate insulation layer.

21. A method of manufacturing a TFT according to claim 14, wherein the first gate insulation layer is formed from silicon oxide ($SiO_2$).

22. A method of manufacturing a TFT according to claim 14, wherein the first gate insulation layer is formed from silicon nitride ($SiN_x$).

23. A method of manufacturing a TFT according to claim 18, wherein brushing the first gate insulation layer removes polymer contaminates.

24. A method of manufacturing a TFT according to claim 20, wherein forming a second gate insulation layer forms a second gate insulation layer that is between 900Å and 2100Å thick.

* * * * *